US009558827B2

(12) United States Patent
Seo et al.

(10) Patent No.: US 9,558,827 B2
(45) Date of Patent: Jan. 31, 2017

(54) SEMICONDUCTOR MEMORY DEVICE HAVING MEMORY STRINGS INCLUDING DRAIN-SIDE AND SOURCE-SIDE MEMORY CELLS CONNECTED TO PIPE TRANSISTOR AND PERIPHERAL CIRCUIT SUITABLE FOR APPLYING PIPE GATE VOLTAGE TO PIPE TRANSISTOR DURING READ OPERATION

(71) Applicant: SK hynix Inc., Gyeonggi-do (KR)

(72) Inventors: Moon Sik Seo, Gyeonggi-do (KR); Kyung Sik Mun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/697,447

(22) Filed: Apr. 27, 2015

(65) Prior Publication Data

US 2016/0172048 A1 Jun. 16, 2016

(30) Foreign Application Priority Data

Dec. 12, 2014 (KR) ........................ 10-2014-0179778

(51) Int. Cl.
*G11C 16/04* (2006.01)
*G11C 16/24* (2006.01)
*G11C 16/34* (2006.01)
*H01L 27/115* (2006.01)

(52) U.S. Cl.
CPC ........... *G11C 16/0483* (2013.01); *G11C 16/24* (2013.01); *G11C 16/3427* (2013.01); *H01L 27/115* (2013.01); *H01L 27/11521* (2013.01)

(58) Field of Classification Search
CPC ..... H01L 27/115; H01L 27/11521; G11C 16/10
USPC ........................... 365/185.05, 185.11, 185.18
See application file for complete search history.

(56) References Cited

U.S. PATENT DOCUMENTS

2014/0355346 A1* 12/2014 Park .................. G11C 16/0483
365/185.11
2015/0036429 A1* 2/2015 Kim .................. H01L 27/11551
365/185.05
2015/0124530 A1* 5/2015 Jung .................. G11C 16/0483
365/185.17

FOREIGN PATENT DOCUMENTS

| KR | 1020050112987 | 12/2005 |
| KR | 1020120000900 | 1/2012 |
| KR | 1020120134941 | 12/2012 |
| KR | 1020130044693 | 5/2013 |
| KR | 1020130095499 | 8/2013 |

* cited by examiner

Primary Examiner — Connie Yoha
(74) Attorney, Agent, or Firm — IP & T Group LLP

(57) ABSTRACT

A semiconductor memory device is provided. The semiconductor memory device includes memory strings including drain-side memory cells connected between a bit line and a pipe transistor, and source-side memory cells connected between the pipe transistor and a source line, and a peripheral circuit suitable for applying a pipe gate voltage to a pipe gate of the pipe transistor before applying pass voltages to turn on non-selected memory cells among the drain-side memory cells and the source-side memory cells during a read operation.

20 Claims, 6 Drawing Sheets

SEMICONDUCTOR MEMORY DEVICE HAVING MEMORY STRINGS INCLUDING DRAIN-SIDE AND SOURCE-SIDE MEMORY CELLS CONNECTED TO PIPE TRANSISTOR AND PERIPHERAL CIRCUIT SUITABLE FOR APPLYING PIPE GATE VOLTAGE TO PIPE TRANSISTOR DURING READ OPERATION

CROSS-REFERENCE TO RELATED APPLICATION

The present application claims priority to Korean patent application number 10-2014-0179778, filed on Dec. 12, 2014, the entire disclosure of which is herein incorporated by reference in its entirety.

BACKGROUND

Field of Invention

The present invention relates to a semiconductor memory device. More specifically, the present invention relates to a three-dimensional semiconductor memory device.

Description of Related Art

Semiconductor memory devices are being developed in various structures that are capable of increasing integration degree. One example of this is three-dimensional semiconductor memory devices.

Three-dimensional memory devices include memory cells which are stacked on a substrate along a channel film. Integration of a three-dimensional memory device is improved as the stacking of the three-dimensional memory cells increases. A three-dimensional memory device includes a memory block having a structure that is different from that of a two-dimensional memory device. Accordingly, in order to secure operational reliability, various technology developments suitable for the structures of the three-dimensional memory device are required.

SUMMARY

The present invention is directed to a semiconductor memory device capable of improving reliability of a read operation.

One aspect of the present invention provides a semiconductor memory device, including: memory strings including drain-side memory cells connected between a bit line and a pipe transistor, and source-side memory cells connected between the pipe transistor and a source line; and a peripheral circuit suitable for applying a pipe gate voltage to a pipe gate of the pipe transistor before applying pass voltages to turn on non-selected memory cells among the drain-side memory cells and the source-side memory cells during a read operation.

Another aspect of the present invention provides a semiconductor memory device, including: memory strings including drain-side memory cells connected between a bit line and a pipe transistor, and source-side memory cells connected between the pipe transistor and a source line; and a peripheral circuit suitable for increasing a pipe gate voltage applied to a pipe gate of the pipe transistor in a stepwise manner during a read operation.

DETAILED DESCRIPTION

Exemplary embodiments of the present invention will be described more fully hereinafter with reference to the accompanying drawings. The present invention may, however, be embodied in different forms and should not be construed as limited to the embodiments set forth herein. Exemplary embodiments of the present invention are described below in sufficient detail with reference to accompanying drawings to enable those of ordinary skill in the art to embody and practice the present invention.

Figure 1:
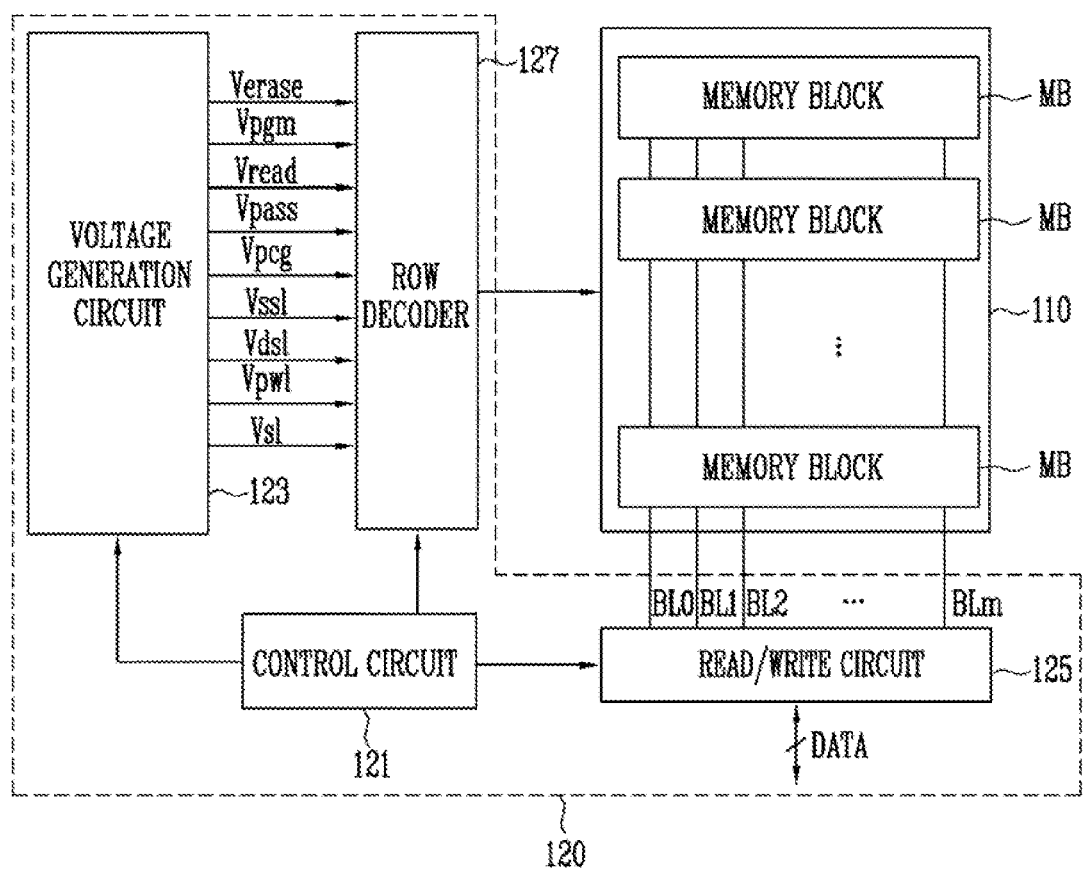
FIG. 1 is a block diagram illustrating a semiconductor memory device according to an embodiment of the present invention.

FIG. 1 is a block diagram illustrating a semiconductor memory device according to an embodiment of the present invention.

Referring to FIG. 1, a semiconductor memory device may include a memory array 110 and a peripheral circuit 120.

The memory array 110 may include a plurality of memory blocks MB. Each of the memory blocks MB may include a plurality of memory strings. A structure of each of the memory strings will be described hereinafter with reference to FIG. 2. The memory blocks MB may be connected to the peripheral circuit 120 through bit lines BL0 to BLm. The memory blocks MB may be connected to the peripheral circuit 120 through word lines and select lines.

The peripheral circuit 120 may perform an operation related to data input and output. For example, the peripheral circuit 120 may perform a program operation, a verifying operation, an erase operation, and a read operation. In order to perform the program operation, the verifying operation, the erase operation, and the read operation, the peripheral circuit 120 may include a control circuit 121, a voltage generation circuit 123, a read/write circuit 125, and a row decoder 127. The peripheral circuit 120 may selectively output one or more of operating voltages Verase, Vpgm, Vread, Vpass, Vpcg, Vssl, Vdsl, Vpwl, and Vsl to a selected memory block according to control of the control circuit 121. The peripheral circuit 120 may control a precharge/discharge operation of the bit lines BL0 to BLm, and may sense current flows of the bit lines BL0 to BLm. The peripheral circuit 120 will be described hereinafter in detail.

The control circuit 121 may be connected to the voltage generation circuit 123, the read/write circuit 125, and the row decoder 127. The control circuit 121 may control the program operation, the erase operation, and the read operation of the semiconductor memory device. The control circuit 121 may operate in response to a command signal input from the outside.

The voltage generation circuit 123 may generate the operating voltages Verase, Vpgm, Vread, Vpass, Vpcg, Vssl, Vdsl, Vpwl, and Vsl having target levels for the program operation, the verifying operation, the erase operation, and the read operation of the semiconductor memory device in response to a control signal of the control circuit 121.

The row decoder 127 may transfer the operating voltages Verase, Vpgm, Vread, Vpass, Vpcg, Vssl, Vdsl, Vpwl, and Vsl to the selected memory block of the memory array 110 in response to a row address signal of the control circuit 121.

The read/write circuit 125 may be connected to the memory blocks MB of the memory array 110 through the bit lines BL0 to BLm. The read/write circuit 125 may selectively precharge the bit lines BL0 to BLm according to the control signal of the control circuit 121 and data DATA transferred from the outside. The read/write circuit 125 may sense a voltage difference and the current flows of the bit lines BL0 to BLm and latch data read from a selected memory cell after precharging the bit line BL0 to BLm according to the control signal of the control circuit 121.

Figure 2:
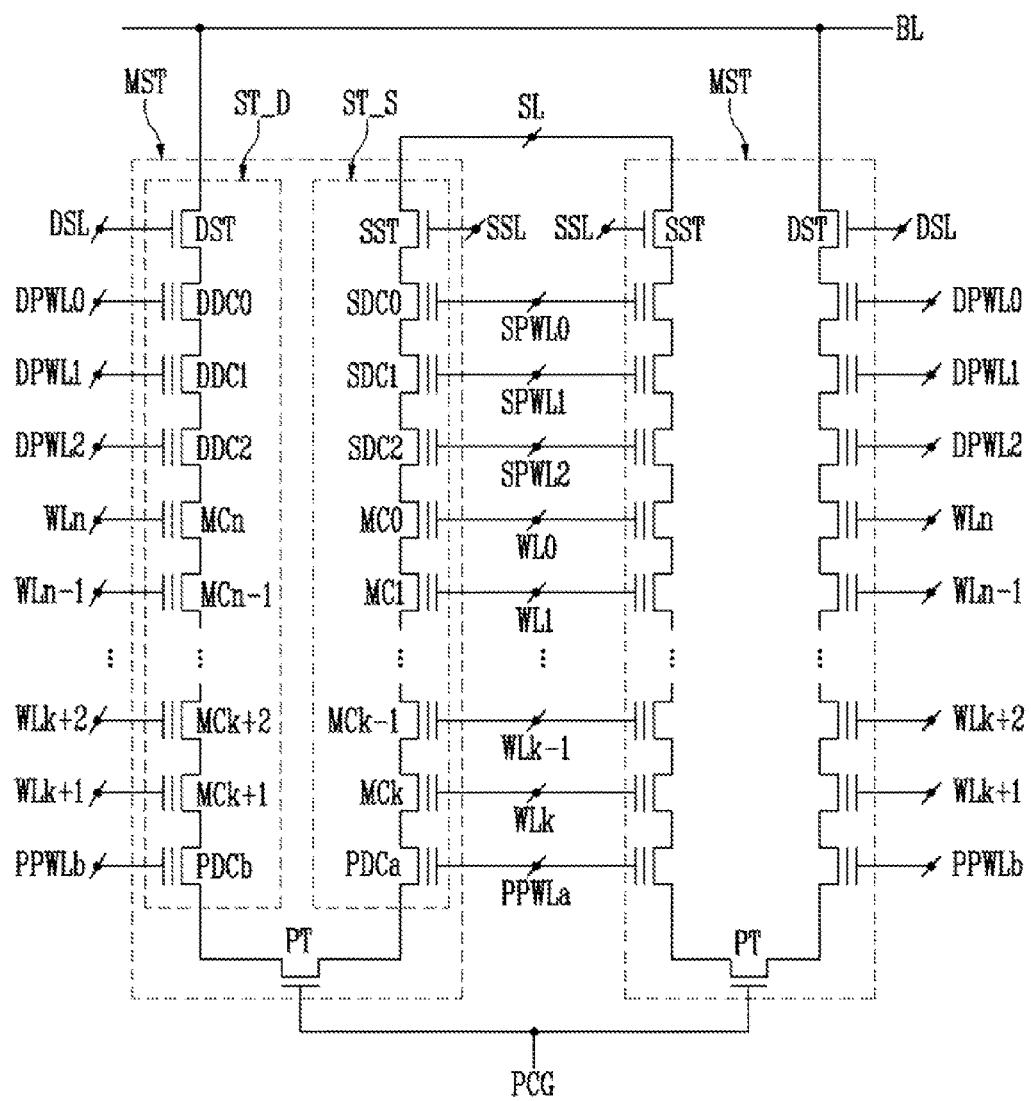
FIG. 2 is a circuit diagram illustrating a memory string included in a memory block shown in FIG. 1.

FIG. 2 is a circuit diagram illustrating a memory string included in one of the memory blocks MB shown in FIG. 1.

Referring to FIG. 2, each of the memory blocks may include a plurality of memory strings MST connected between the bit line BL and a source line SL. Each of the memory strings MST may include a pipe transistor PT, a drain-side memory string ST_D, and a source-side memory string ST_S. The pipe transistor PT may be arranged on a lower portion of the bit line BL and the source line SL. The drain-side memory string ST_D may be connected between the bit line BL and the pipe transistor PT. The source-side memory string ST_S may be connected between the source line SL and the pipe transistor PT.

The pipe transistor PT may include a gate connected to a pipe gate PCG, and may be controlled by a voltage applied to the pipe gate PCG. The pipe transistor PT may electrically connect channels of the source-side memory string ST_S and the drain-side memory string ST_D in the selected memory block.

The source-side memory string ST_S may include a source select transistor SST connected between the source line SL and the pipe transistor PT, and source-side memory cells MC0 to MCk connected between the source select transistor SST and the pipe transistor PT. The source-side memory string ST_S may further include two or more source-side dummy cells, for example, three source-side dummy cells SDC0 to SDC2 as shown in FIG. 2, connected between the source select transistor SST and the source-side memory cells MC0 to MCk. The source-side memory string ST_S may further include a first pipe-side dummy cell PDCa connected between the source-side memory cells MC0 to MCk and the pipe transistor PT.

The source select transistor SST may include a gate connected a source select line SSL, and may be controlled by a voltage applied to the source select line SSL. The source select transistor SST may control connection and disconnection between the memory string MST and the source line SL.

Gates of the source-side memory cells MC0 to MCk may be connected to source-side word lines WL0 to WLk, which are stacked on the pipe gate PCG, respectively. The source-side memory cells MC0 to MCk may be controlled by a voltage applied to the source-side word lines WL0 to WLk.

Gates of the source-side dummy cells SDC0 to SDC2 may be connected to the source-side dummy lines SPWL0 to SPWL2 which are stacked on the source-side word lines WL0 to WLk. Gates of the source side dummy cells SDC0 to SDC2 may be respectively connected to source-side dummy lines SPWL0 to SPWL2, which are stacked on the source-side word lines WL0 to WLk. The source-side dummy cells SDC0 to SDC2 may be controlled by a voltage applied to the source-side dummy lines SPWL0 to SPWL2.

The first pipe-side dummy cell PDCa may include a gate connected to a first pipe-side dummy line PPWLa, and be controlled by a voltage applied to the first pipe-side dummy line PPWLa.

The drain-side memory string ST_D may include a drain select transistor DST connected between the bit line BL and the pipe transistor PT, and drain-side memory cells MCk+1 to MCn connected between the drain select transistor DST and the pipe transistor PT. The drain-side memory string ST_D may further include two or more drain-side dummy cells, for example, three drain-side dummy cells DDC0 to DDC2 as shown in FIG. 2, connected between the drain select transistor DST and the drain-side memory cells MCk+1 to MCn. The drain-side memory string ST_D may further include a second pipe-side dummy cell PDCb connected between the drain-side memory cells MCk+1 to MCn and the pipe transistor PT.

The drain select transistor DST may include a gate connected to a drain select line DSL, and may be controlled by a voltage applied to the drain select line DSL. The drain select transistor DST may control connection or disconnection between the memory string MST and the bit line BL.

Gates of the drain-side memory cells MCk+1 to MCn may be connected to drain-side word lines WLk+1 to WLn which are stacked on the pipe gate PCG, respectively. The drain-side memory cells MCk+1 to MCn may be controlled by a voltage applied to the drain-side word lines WLk+1 to WLn.

Gates of the drain-side dummy cells DDC0 to DDC2 may be connected to drain-side dummy lines DPWL0 to DPWL2, respectively. The drain-side dummy cells DDC0 to DDC2 may be controlled by a voltage applied to the drain-side dummy lines DPWL0 to DPWL2.

The second pipe-side dummy cell PDCb may include a gate connected to a second pipe-side dummy line PPWLb, and be controlled by a voltage applied to the second pipe-side dummy line PPWLb.

In accordance with an embodiment of the present invention, the semiconductor memory device may include a plurality of memory strings MST commonly connected to a single bit line BL in each of the memory blocks MB. The plurality of memory strings MST may be connected to the word lines WL0 to WLn along an extended direction of the word lines WL0 to WLn. The number of memory strings MST, which are commonly connected to the single bit line BL while controlled by a single word line in each of the memory blocks MB, may vary according to a design. In each of the memory strings MST, how many stacked source-side memory cells MC0 to MCk and stacked drain-side memory cells MCk+1 to MCn there are may vary according depending on the design.

In accordance with an embodiment of the present invention, the semiconductor memory device may perform the program operation and the read operation by units of pages in a selected memory block. The memory cells connected to a single word line, for example, WL0, among the memory cells may form a single page in each of the memory blocks MB.

The load capacitance of a semiconductor memory device increases when the semiconductor memory device has an increased number of the memory strings MST in a memory block and increased numbers of stacked source-side memory cells MC0 to MCk and stacked drain-side memory cells MCk+1 to MCn for better integration. In general, a pipe gate PCG has great load capacitance. In accordance with an embodiment of the present invention, the semiconductor memory device may prevent the memory blocks MB from increased load capacitance and read stress despite having an increased number of the memory strings MST in each of the memory blocks MB through following operation.

In accordance with an embodiment of the present invention, during the read operation, the peripheral circuit 120 may block a channel of a non-selected memory string among the memory strings MST from the bit line BL and the source line SL so that the non-selected memory string has a voltage that is boosted by the voltages applied to the word lines WL0 to WLn.

In accordance with an embodiment of the present invention, the semiconductor memory device may perform the read operation while boosting the channel of the non-selected memory string. In accordance with an embodiment of the present invention, 1.6V or more of threshold voltages of the source select transistor SST and the drain select transistor DST may reduce the leakage current through the source select transistor SST and the drain select transistor DST of the non-selected memory string during a read operation. Accordingly, in accordance with an embodiment of the present invention, the semiconductor memory device may maintain the boosted level of the channel of the non-selected memory string.

Further, in accordance with an embodiment of the present invention, the peripheral circuit 120 may apply the pipe gate voltage Vpcg to the pipe gate PCG having a relatively great load capacitance before applying the pass voltage Vpass to the word lines WL0 to WLn, which reduces the disturbance during the read operation.

Figure 3:
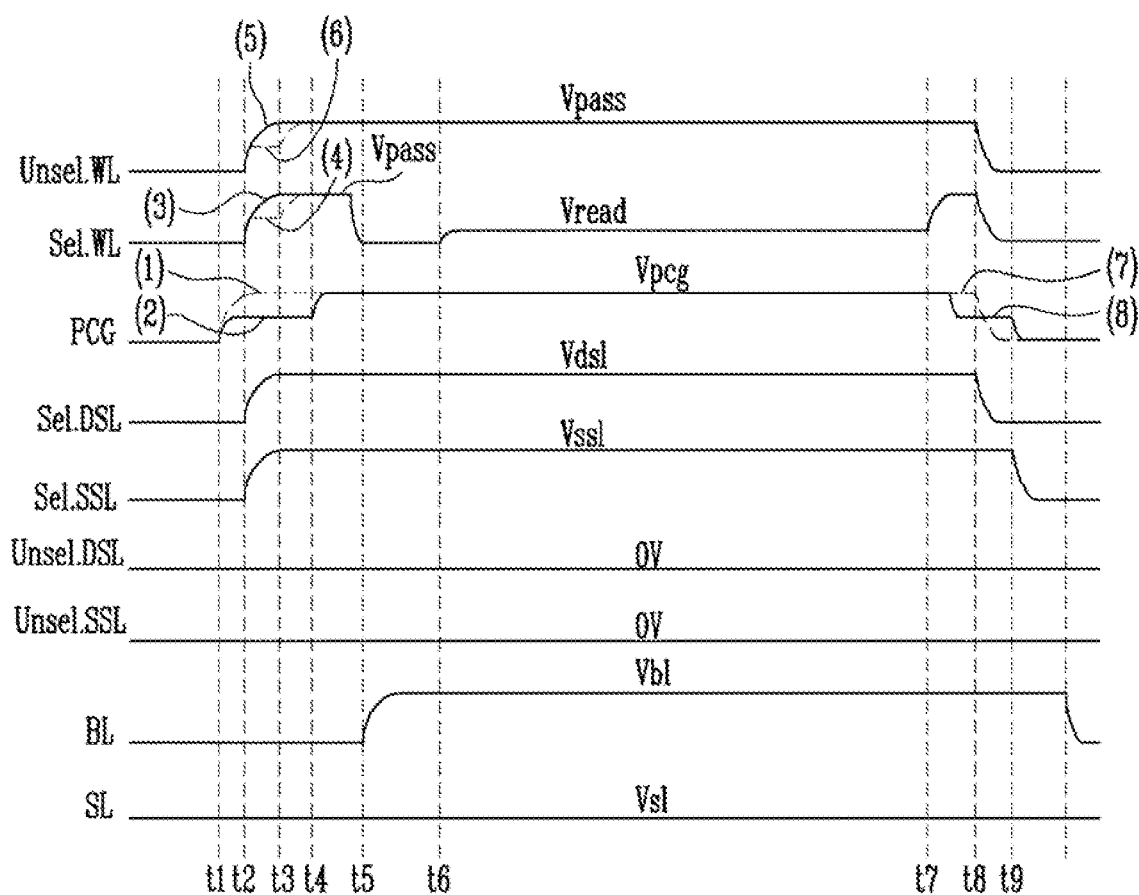
FIG. 3 is a waveform illustrating an operation of a semiconductor memory device shown in FIG. 1.

FIG. 3 is a waveform illustrating an operation of the semiconductor memory device shown in FIG. 1. The peripheral circuit 120 of the semiconductor memory device may control the operation of the semiconductor memory device.

Referring to FIG. 3, during the read operation, voltages levels for turning off a non-selected drain select transistor and a non-selected source select transistor may be applied to a non-selected drain select line "Unsel. DSL" and a non-selected source select line "Unsel. SSL". For example, zero volts (0V) may be applied to the non-selected drain select line "Unsel. DSL" and the non-selected source select line "Unsel. SSL". Further, during the read operation, the source line voltage Vsl may be applied to the source line SL. For example, the source line voltage Vsl may be a ground voltage.

During the read operation, the pipe gate voltage Vpcg may be applied to the pipe gate PCG at a first time point t1, and the pass voltages Vpass may be applied to non-selected word lines "Unsel. WL" and a selected word line "Sel. WL" at a second time point t2. The drain select line voltage Vdsl having a level for turning on the drain select transistor may be applied to a selected drain select line "Sel. DSL" at the time point t2, and the source select line voltage Vssl having a level for turning on the source select transistor may be applied to a selected source select line "Sel. SSL".

During the read operation, the pass voltages Vpass may be applied to the source-side dummy lines SPWL0 to SPWL2, the drain-side dummy lines DPWL0 to DPWL2, and the pipe-side dummy lines PPWLa and PPWLb shown in FIG. 2.

The pipe gate voltage Vpcg may have a voltage level for turning on the pipe transistor, and the pass voltages Vpass may have a voltage level for turning on the memory cell regardless of a state of the memory cell.

In accordance with an embodiment of the present invention, the semiconductor memory device may apply the pipe gate voltage Vpcg to the pipe gate PCG having a relatively great load capacitance before applying the pass voltages Vpass to the non-selected word lines "Unsel. WL" and the selected word line "Sel. WL". Accordingly, the semiconductor memory device may minimize the disturbance of the memory cells MCk and MCk+1 adjacent to the pipe gate PCG.

As shown by a dotted line "(1)" of FIG. 3, the pipe gate voltage Vpcg may directly reach a target level.

As shown by a solid line "(2)" of FIG. 3, the pipe gate voltage Vpcg may reach the target level in a stepwise manner. For example, the pipe gate voltage Vpcg having the intermediate level and then the pipe gate voltage Vcpg having the target level may be sequentially applied to the pipe gate PCG.

Accordingly, the semiconductor memory device may minimize a channel potential difference between the pipe transistor PT and the memory cell MCk and MCk+1 adjacent thereto, which occurs due to a time difference between a rising edges of the pipe gate voltage Vpcg and the pass voltages Vpass, by sequentially raising the pipe gate voltage Vpcg to the target level in the stepwise manner.

The pass voltages Vpass applied to all of the word lines "Sel. WL" and "Unsel. WL" in the memory block may reach the target level in different ways according to a load difference between the word lines "Sel. WL" and "Unsel. WL". As shown by solid lines "(3)" and "(5)" of FIG. 3, the pass voltages Vpass for first word line groups having a relatively great load capacitance may directly reach the target level. On the other hand, as shown by dotted lines "(4)" and "(6)" of FIG. 3, the pass voltages Vpass for second word line groups having a relatively small load capacitance may reach the target level in a stepwise manner.

The first word line group and the second word line group may be determined according to a position of the word lines "Sel. WL" and "Unsel. WL". Referring to FIG. 2, the source-side word lines WL0 to WLk may be stacked with space between them, which is the same as the drain-side word lines WLk+1 to WLn. Among the source-side word lines WL0 to WLk or the drain-side word lines WLk+1 to WLn, as the word lines are disposed closer to the bit line BL and the source line SL, areas of the word lines may be smaller. Due to such structural features, the resistances and the load capacitance of the source-side word lines WL0 to WLk and the drain-side word lines WLk+1 to WLn may become greater as the word lines are disposed closer to the bit line BL and the source line SL. The first word line group may be arranged on the upper portion of the second word line group, or the first word line group may be disposed closer to the bit line BL and the source line SL than the second word line group. Therefore, the first word line groups may have relatively high load capacitance, and the second word line groups may have relatively small load capacitance.

Accordingly, in accordance with an embodiment of the present invention, the semiconductor memory device may reduce the disturbance due to the difference of load capacitance by applying the pass voltages Vpass that directly reach the target level for first word line groups, and by applying pass voltages Vpass reaching the target level in the stepwise manner for second word line groups.

In accordance with an embodiment of the present invention, when the semiconductor memory device applies the pass voltages Vpass and the pipe gate voltage Vpcg reaching the corresponding target levels in the stepwise manner, the semiconductor memory device may control the pass voltages Vpass for the word lines "Unsel. WL" and "Sel. WL" to reach its target level before the pipe gate voltage Vpcg reaches its target level.

Referring to time points t3 and t4, the dotted lines "(4)" and "(6)", and the solid line "(2)" of FIG. 3, the semiconductor memory device may control the read operation so that the pass voltages Vpass for the word lines "Unsel. WL" and "Sel. WL" may reach its target level before the pipe gate voltage Vpcg reaches its target level. Accordingly, disturbances due to hot carrier injection (HCI) by local boosting may be reduced.

By the operation described above, the dummy cells, the memory cells, and the pipe transistor of the selected memory string may be turned on, and channel regions of the dummy cells, the memory cells, and the pipe transistor of the selected memory string may be electrically connected to the bit line BL and the source line SL. On the other hand, the dummy cells, the memory cells, and the pipe transistor of the non-selected memory string may be turned on, and the channel regions of the dummy cells, the memory cells, and the pipe transistor of the non-selected memory string may be electrically disconnected from the bit line BL and the source line SL.

Referring to FIG. 3, after the selected memory string is electrically connected to the bit line BL and the source line SL and the non-selected memory string is electrically disconnected from the bit line BL and the source line SL, the bit line BL may be precharged to a bit line voltage Vbl at a time point t5.

After this, the read voltage Vread may be applied to the selected word line "Sel. WL" at a time point t6. Before the read voltage Vread is applied, the pass voltages Vpass applied to the selected word line "Sel. WL" may be discharged.

A period between the time point t6 and a time point t7 may be a sensing period. During the sensing period, a voltage level of the bit line BL may be changed according to a state of data of the selected memory cell connected to the selected word line "Sel. WL". Data stored in the selected memory cell may be read by sensing a difference in the voltage level of the bit line BL in the sensing period.

For example, when a threshold voltage of the selected memory cell is smaller than the read voltage Vread, the selected memory cell may be turned on by the read voltage Vread. At this time, the non-selected memory cells, which form the memory string with the selected memory cells and are connected to the non-selected word lines "Unsel. WL", may be turned on by the pass voltages Vpass. Accordingly, the channel regions of the selected memory cell and the non-selected memory cells in the selected memory string may be electrically connected to the bit line BL and the grounded source line SL. Accordingly, a voltage level of the bit line BL connected to the selected memory string may be discharged to a low level.

On the other hand, when the threshold voltage of the selected memory cell is greater than the read voltage Vread, the selected memory cell may be turned off. Accordingly, a current passing from the bit line BL to the selected memory string may be blocked by the selected memory cell, and may not flow to the grounded source line SL. Accordingly, a voltage level of the bit line BL connected to the selected memory string may be maintained at a high level.

During the sensing period between the time points t6 and t7, the drain select transistor and the source select transistor connected to the non-selected memory string may stay turned off by voltages applied to the non-selected drain select line "Unsel. DSL" and the non-selected source select line "Unsel. SSL". Accordingly, during the sensing period, the non-selected memory string may be electrically disconnected from the bit line BL and the source line SL, and may float. The channel voltage of the floated non-selected memory string may be boosted by the read voltage Vread applied to the selected word line "Sel. WL" and the pass voltage Vpass applied to the non-selected word lines "Unsel. WL". Accordingly, a disturbance in the non-selected memory string may be prevented since the voltage difference between the gates and the channel regions of the memory cells included in the non-selected memory string is reduced.

At a time point t8 after the sensing period, the pass voltage Vpass applied to the non-selected word lines "Unsel. WL" and the read voltage Vread applied to the selected word line "Sel. WL" may be discharged to a low level. Accordingly, all of the memory cells in the memory string may be turned off. The read voltage Vread applied to the selected word line "Sel. WL" may have the same level as the pass voltages Vpass during a period between the time points t7 and t8. The drain select line voltage Vdsl applied to the selected drain select line "Sel. DSL" may be discharged to a low level at the time point t8. Accordingly, the selected drain select transistor may be turned off. The source select line voltage Vssl applied to the selected source select line "Sel. SSL" may be discharged to a low level at a time point t9 after the memory cells and the selected drain select transistor are turned off. Accordingly, the selected source select transistor may be turned off.

In accordance with an embodiment of the present invention, the semiconductor memory device may decrease the pipe gate voltage Vpcg before decreasing the pass voltages Vpass in consideration of the load capacitance of the pipe gate PCG, which is relatively great.

As shown by a dotted line "(7)" of FIG. 3, the pipe gate voltage Vpcg may directly decrease.

As shown in a solid line "(8)" of FIG. 3, the pipe gate voltage Vpcg may decrease in a stepwise manner. Accordingly, in accordance with an embodiment of the present invention, the semiconductor memory device may minimize the channel potential difference between the pipe transistor PT and the memory cells MCk and MCk+1 adjacent thereto, which occurs due to a time difference between a falling edges of the pipe gate voltage Vpcg and the pass voltage Vpass, by sequentially decreasing the pipe gate voltage Vpcg in the stepwise manner.

In accordance with an embodiment of the present invention, the semiconductor memory device may control the read operation so that the pass voltages Vpass may reach their target level before the pipe gate voltage Vpcg reaches its target level.

Figure 4:
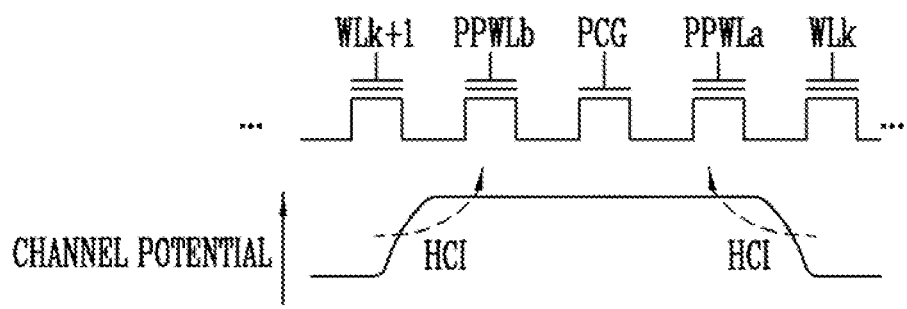
FIG. 4 is a schematic diagram illustrating a disturbance of word lines due to a hot carrier injection (HCI)

FIG. 4 is a schematic diagram illustrating the disturbance of word lines due to the HCI. FIG. 4 exemplarily illustrates the dummy cells PDCa and PDCb, the pipe transistor PT, and the memory cells MCk+1 and MCk adjacent to the pipe gate PCG among the memory cells MC0 to MCn arranged in a simplified manner for a clearer description.

Referring to FIG. 4, when the semiconductor memory device applies the pipe gate voltage Vpcg to the pipe gate PCG before applying the pass voltages Vpass to the word lines "Unsel. WL" and "Sel. WL" of the selected memory string during the read operation, the local boosting may be generated by the pipe gate voltage Vpcg. The local boosting increases the channel potential of the pipe transistor PT connected to the pipe gate PCG, and the voltage difference between the channel of the pipe transistor and the word lines WLk and WLk+1 adjacent to the pipe transistor PT may induce HCI. Accordingly, a disturbance may occur in the word lines WLk and WLk+1 adjacent to the pipe transistor PT.

In accordance with an embodiment of the present invention, the semiconductor memory device may control the read operation so that the pass voltages Vpass may reach their target level in the stepwise manner in order to decrease the channel potential difference between the adjacent memory cells, and thus reduce the disturbance.

Figure 5:
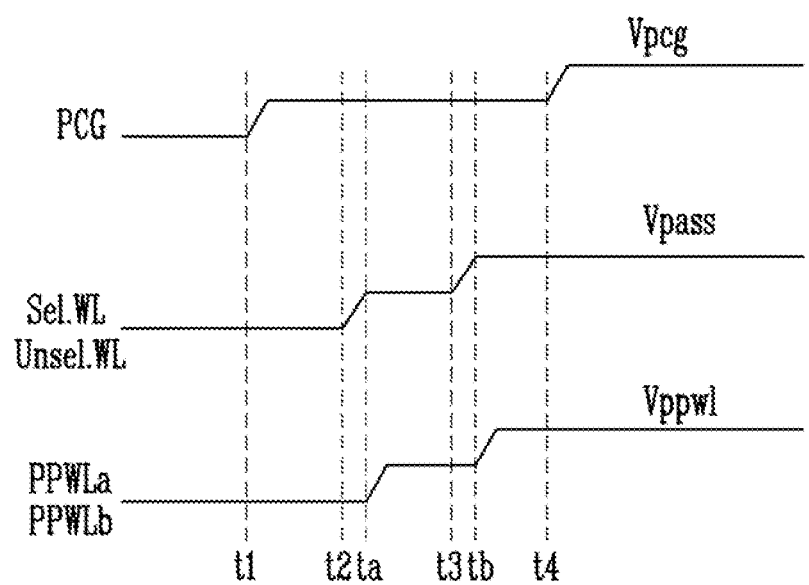
FIG. 5 is a waveform illustrating an operation of a semiconductor memory device shown in FIG. 1.

FIG. 5 is a waveform illustrating an operation of the semiconductor memory device shown in FIG. 1.

FIG. 5 shows the semiconductor memory device applying the pipe gate voltage Vpcg to the pipe gate PCG before applying the pass voltages Vpass to the word lines "Unsel. WL" and "Sel. WL" of the selected memory string during the read operation at the time points t1 and t2, and shows the semiconductor memory device controlling the read operation so that the pass voltages Vpass for the word lines "Unsel. WL" and "Sel. WL" may reach their target level before the pipe gate voltage Vpcg reaches its target level in stepwise manner at the time points t3 and t4, as described with reference to FIG. 3.

Referring to FIG. 5, in order to reduce the disturbance described above with reference to FIG. 4, during the read operation, the semiconductor memory device may apply the pipe-side dummy voltages Vppwl to the first and second pipe-side dummy lines PPWLa and PPWLb, and the semiconductor memory device may control the pipe-side dummy voltages Vppwl to have waveforms different from those of the pass voltages Vpass applied to the word lines "Sel. WL" and "Unsel. WL".

More particularly, the pipe-side dummy voltages Vppwl may reach the target level in a stepwise manner. For example, the pipe-side dummy voltages Vppwl having the intermediate level and then the pipe-side dummy voltages Vppwl having the target level may be sequentially applied to the first and second pipe-side dummy lines PPWLa and PPWLb.

As shown by time points t1, t2 and ta of FIG. 5, the pipe-side dummy voltages Vppwl may be applied after applying the pipe gate voltage Vpcg and the pass voltages Vpass.

As shown by time points t3, t4 and tb of FIG. 5, the semiconductor memory device may control the read operation so that the pipe-side dummy voltages Vppwl may reach their target level between when the pass voltages Vpass for the word lines "Unsel. WL" and "Sel. WL" reaches its target level and when the pipe gate voltage Vpcg reaches its target level. After reaching its target level, the pipe-side dummy voltages Vppwl may have the same waveform as that of the pass voltages Vpass described with reference to FIG. 3.

Figure 6:
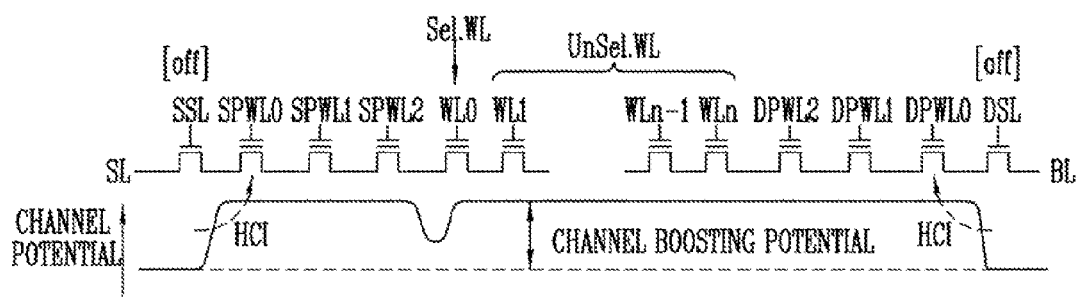
FIG. 6 is a schematic diagram illustrating a disturbance of word lines due to an HCI.

FIG. 6 is a schematic diagram illustrating the disturbance of word lines due to the HCI. FIG. 6 exemplarily illustrates the cells and the transistors of one of the memory strings MST in a simplified straight-line manner for a clearer description.

Referring to FIG. 6, when the semiconductor memory device applies a turn-off voltage to the source select transistor SST and the drain select transistor DST through the source select line SSL and the drain select line DSL of the non-selected memory string, the channel of the non-selected memory string may be electrically disconnected from the source line SL and the bit line BL. Accordingly, the channel of the non-selected memory string may float, and may have a potential boosted by the pass voltages Vpass and the read voltage Vread applied to the selected word line "Sel. WL" and the non-selected word lines "Unsel. WL". Due to the potential boost, when the channel potential of the non-selected memory string is increased, HCI may be induced by a difference between the channel voltage of the non-selected memory string and the voltages of the selected lines DSL and SSL, and the disturbance may occur.

In accordance with an embodiment of the present invention, the semiconductor memory device may apply voltages of different levels to the source-side dummy lines SPWL0 to SPWL2, respectively, or may apply voltages of different levels to the drain side dummy lines DPWL0 to DPWL2, respectively, in order to reduce the disturbance.

Figure 7A:
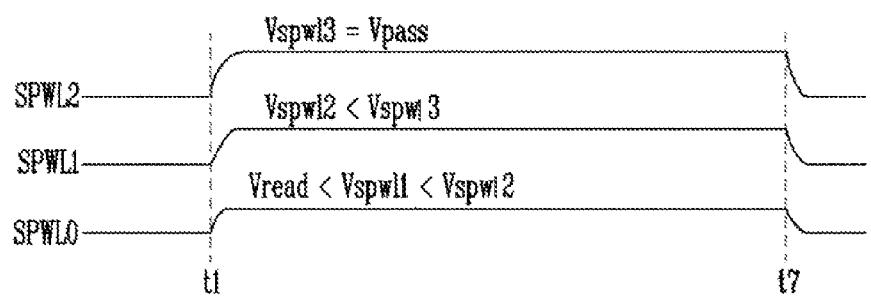
FIGS. 7A and 7B are waveforms illustrating an operation of a semiconductor memory device shown in FIG. 1.
Figure 7B:
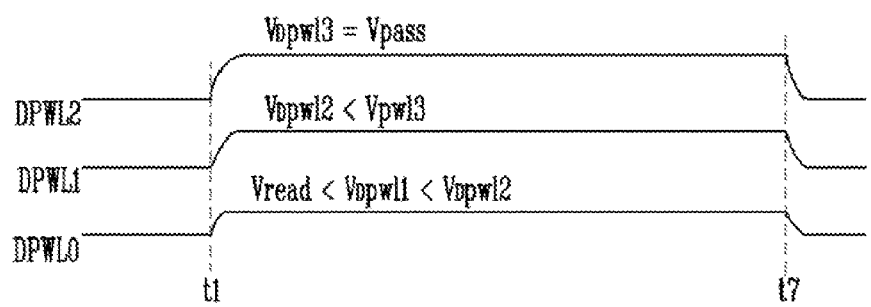

FIGS. 7A and 7B are waveforms illustrating an operation of the semiconductor memory device shown in FIG. 1.

Referring to FIGS. 7A and 7B, in order to reduce the disturbance described above with reference to FIG. 6, during the read operation, the semiconductor memory device may apply the voltages, which are different from those of the pass voltages Vpass applied to the non-selected word lines "Unsel. WL" described above with reference to FIG. 3, to the source-side dummy lines SPWL0 to SPWL2 and the drain-side dummy lines DPWL0 to DPWL2.

More particularly, as shown in FIG. 7A, different voltage levels Vspwl1 to Vspwl3 for turning on the source-side dummy cells SDC0 to SDC2 may be applied to the source-side dummy lines SPWL0 to SPWL2 during a period between the first time points t1 and t7 described above with reference to FIG. 3. In order to reduce the disturbance, the voltage levels Vspwl1 to Vspwl3 applied to the source-side dummy lines SPWL0 to SPWL2 may become lower as the source-side dummy lines SPWL0 to SPWL2 are disposed closer to the source line SL shown in FIG. 6. For example, the voltage of the first level Vspwl1 may be applied to the first source-side dummy line SPWL0 adjacent to the source line SL, and the voltage of the third level Vspwl3 may be applied to the third source-side dummy line SPWL2 adjacent to the word line WL0 shown in FIG. 6. The voltage of the second level Vspwl2 may be applied to the second source-side dummy line SPWL1 between the first and third source-side dummy lines SPWL0 and SPWL2. The first level Vspwl1 may be lower than the second level Vspwl2, and the second level Vspwl2 may be lower than the third level Vspwl3. The third level Vspwl3, which is the highest voltage level among the voltage levels applied to the source-side dummy lines SPWL0 to SPWL2, may be equal to the levels of the pass voltages Vpass described above with reference to FIG. 3. The first level Vspwl1 of the lowest level among the voltage levels applied to the source-side dummy lines SPWL0 to SPWL2 may be greater than the read voltage Vread described above with reference to FIG. 3, and may be equal to or greater than 4 V in order to secure the proper amount of a cell current.

As shown in FIG. 7B, different voltage levels Vdpwl1 to Vdpwl3 for turning on the drain-side dummy cells DDC0 to DDC2 may be applied to the drain-side dummy lines DPWL0 to DPWL2 in a period between the time points t1 and t7 described above with reference to FIG. 3. In order to reduce the disturbance, the voltage levels Vdpwl1 to Vdpwl3 applied to the drain-side dummy lines DPWL0 to DPWL2 may become lower as the drain-side dummy lines DPWL0 to DPWL2 are disposed closer to the bit line BL shown in FIG. 6. For example, the voltage of the first level Vdpwl1 may be applied to the first drain-side dummy line DPWL0 adjacent to the bit line BL, and the voltage of the third level Vdpwl3 may be applied to the third drain-side dummy line DPWL2 adjacent to the word line WLn shown in FIG. 6. The voltage of the second level Vdpwl2 may be applied to the second drain-side dummy line DPWL1 between the first and third drain-side dummy lines DPWL0 and DPWL2. The first level Vdpwl1 may be lower than the second level Vdpwl2, and the second level Vdpwl2 may be lower than the third level Vdpwl3. The third level Vspwl3 may be the highest level among the voltage levels applied to the drain-side dummy lines DPWL0 to DPWL2 and may be equal to the voltage levels of the pass voltages Vpass described above with reference to FIG. 3. The first level Vdpwl1 of the lowest level among the voltage levels applied to the drain-side dummy lines DPWL0 to DPWL2 may be greater than the read voltage Vread described above with reference to FIG. 3, and may be equal to or greater than 4 V in order to secure the proper amount of cell current.

Figure 8:
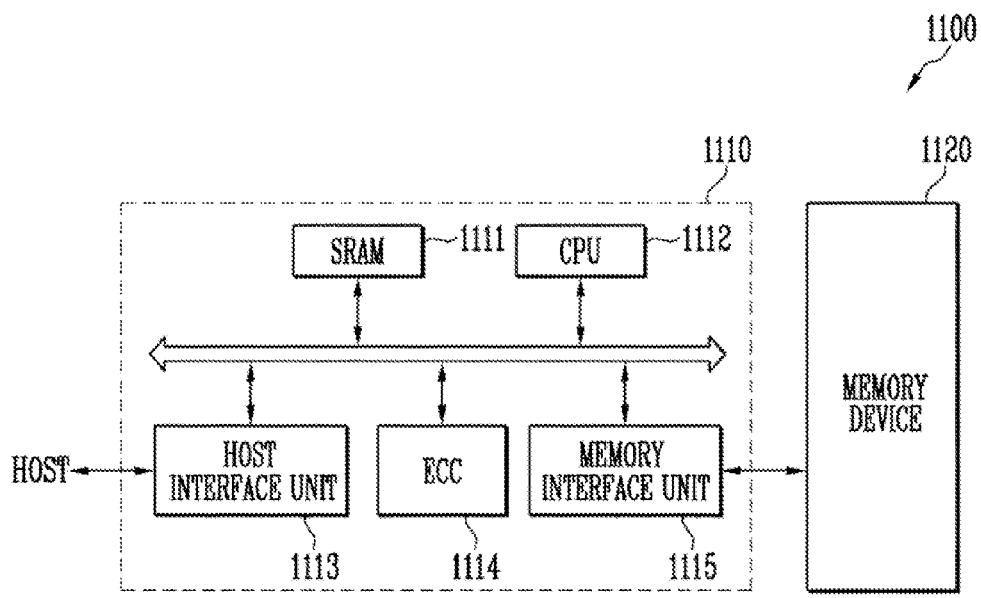
FIG. 8 is a block diagram illustrating a memory system according to an embodiment of the present invention.

FIG. 8 is a block diagram illustrating a memory system according to an embodiment of the present invention.

Referring to FIG. 8, a memory system 1100 according to an embodiment of the present invention may include a memory device 1120 and a memory controller 1110.

The memory device 1120 may have the same structure as the semiconductor memory device described above with reference to FIGS. 1 and 2, and may perform the same operations as the semiconductor memory device described above with reference to FIGS. 3, 5, 7A and 7B. Further, the memory device 1120 may be a multi-chip package in which a plurality of flash memory chips are included.

The memory controller 1110 may control the memory device 1120, and may include a static random access memory (SRAM) 1111, a central processing unit (CPU) 1112, a host interface unit 1113, an error correction circuit (ECC) 1114, and a memory interface unit 1115. The SRAM 1111 may be used as an operating memory of the CPU 1112, the CPU 1112 may perform various control operations for data exchange of the memory controller 1110, and the host interface unit 1113 may include a data exchange protocol of a host connected to the memory system 1100. Further, the ECC 1114 may detect and correct errors included in data read from the memory device 1120, and the memory interface unit 1115 may perform an interface with the memory device 1120. Further, the memory controller 1110 may further include a read only memory (ROM), etc. for storing code data for an interface with the host.

The memory system 1100 may be a memory card or a solid state disk (SSD) configured by combining the memory device 1120 and the memory controller 1110. For example, when the memory system 1100 is the SSD, the memory controller 1110 may communicate with the outside (for example, the host) through at least one among various protocols such as a Universal Serial Bus (USB) protocol, a MultiMediaCard (MMC) protocol, a Peripheral Component Interconnect (PCI)-Express (PCI-E) protocol, a Serial Advanced Technology Attachment (SATA) protocol, a Parallel ATA (PATA) protocol, a Small Computer System Interface (SCSI) protocol, an Enhanced Small Disk Interface (ESDI) protocol, an Integrated Drive Electronics (IDE) protocol, etc.

Figure 9:
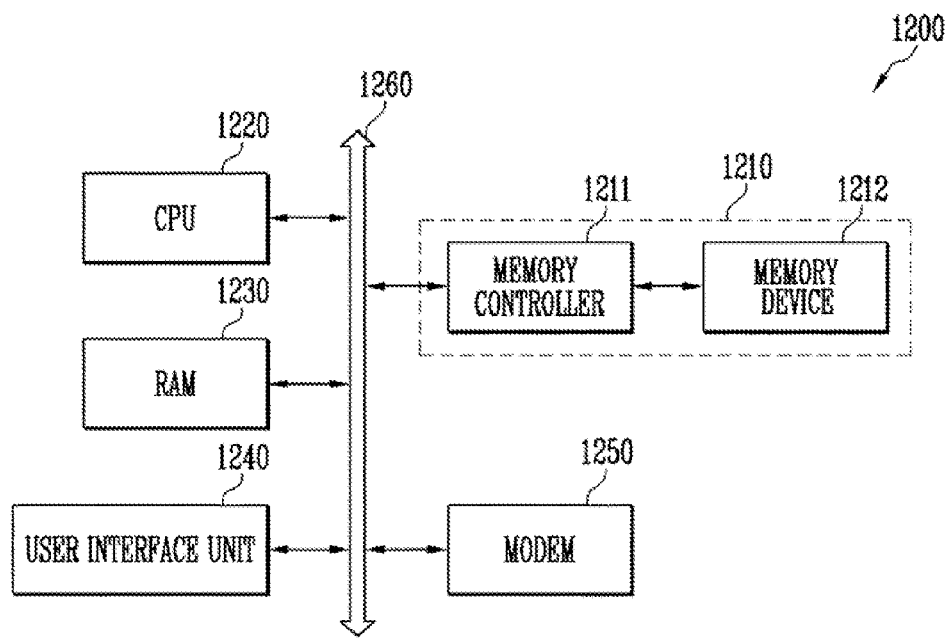
FIG. 9 is a block diagram illustrating a computing system according to an embodiment of the present invention.

FIG. 9 is a block diagram illustrating a computing system according to an embodiment of the present invention.

Referring to FIG. 9, a computing system 1200 according to an embodiment of the present invention may include a CPU 1220, a RAM 1230, a user interface unit 1240, a modem 1250, and a memory system 1210, which are electrically connected to a system bus 1260. Further, when the computing system 1200 is a mobile device, a battery for supplying an operating voltage to the computing system 1200 may be further included, and an application chipset, a camera image processor (CIS), and a mobile DRAM, etc. may be further included.

The memory system 1210 may Include a memory device 1212, and a memory controller 1211 as described above with reference to FIG. 8.

An embodiment of the present invention can improve reliability of read operations by controlling the waveform of the pipe gate voltage applied to the pipe gate during the read operations.

The technical spirit of the present invention has been described above in detail with reference to exemplary embodiments, but it should be noted that the embodiments intended for the description only and not for limiting the scope of the present invention. Therefore, it will be understood by those of ordinary skill in the art that various changes in form and detail may be made without departing from the spirit and scope of the present invention as defined by the following claims.

What is claimed is:

1. A semiconductor memory device, comprising:
   memory strings including drain-side memory cells connected between a bit line and a pipe transistor, and source-side memory cells connected between the pipe transistor and a source line; and
   a peripheral circuit suitable for applying a pipe gate voltage to a pipe gate of the pipe transistor before applying pass voltages to turn on non-selected memory cells among the drain-side memory cells and the source-side memory cells during a read operation.

2. The semiconductor memory device of claim 1,
   wherein the peripheral circuit turns on the pipe transistor by applying the pipe gate voltage to the pipe gate during the read operation in a stepwise manner, and
   wherein the peripheral circuit applies the pipe gate voltage such that it reaches a target level in the stepwise manner.

3. The semiconductor memory device of claim 1, wherein the peripheral circuit applies the pass voltages such that they reach a first target level before the pipe gate voltage reaches a second target level, during the read operation.

4. The semiconductor memory device of claim 1, wherein the peripheral circuit applies the pass voltages in a stepwise manner to reach a target level.

5. The semiconductor memory device of claim 1, wherein each of the memory strings further comprises:
   a first pipe-side dummy cell connected between the pipe transistor and the source-side memory cells;
   a second pipe-side dummy cell connected between the pipe transistor and the drain-side memory cells;
   a source select transistor connected between the source-side memory cells and the source line; and
   a drain select transistor connected between the drain-side memory cells and the bit line.

6. The semiconductor memory device of claim 5, wherein the peripheral circuit turns on the first and second pipe-side dummy cells by applying pipe-side dummy voltages reaching a third target level in a stepwise manner to first and second pipe-side dummy lines connected to the first and second pipe-side dummy cells, respectively, during the read operation.

7. The semiconductor memory device of claim 6, wherein the peripheral circuit applies the pipe-side dummy voltages after applying the pass voltage.

8. The semiconductor memory device of claim 6, wherein the peripheral circuit controls operations such that the pipe-side dummy voltages reach the third target level before the pipe gate voltage reaches a second target level.

9. The semiconductor memory device of claim 6, wherein the peripheral circuit controls operations such that the pipe-side dummy voltages reach the third target level after the pass voltage reaches a first target level.

10. The semiconductor memory device of claim 1, wherein the peripheral circuit is suitable for applying a read voltage to a selected memory cell among the source-side memory cells and the drain-side memory cells after a selected memory string among the memory strings is connected between the bit line and the source line and a non-selected memory string floats between the bit line and the source line during the read operation.

11. The semiconductor memory device of claim 10, wherein the peripheral circuit controls operations so that the pipe gate voltage decreases in a stepwise manner after applying the read voltage.

12. The semiconductor memory device of claim 1, wherein each of the memory strings further comprises:
two or more drain-side dummy cells connected between the bit line and the drain-side memory cells; and
two or more source-side dummy cells connected between the source line and the source-side memory cells.

13. The semiconductor memory device of claim 12, wherein the peripheral circuit independently controls voltage levels that are applied to drain-side dummy lines, which connected to the drain-side dummy cells, according to a position of the drain-side dummy cells during the read operation.

14. The semiconductor memory device of claim 13, wherein the peripheral circuit lowers the voltage levels applied to the drain-side dummy lines as the drain-side dummy lines become closer to the bit line during the read operation.

15. The semiconductor memory device of claim 13, wherein the peripheral circuit controls the voltage levels applied to the drain-side dummy lines to turn on the drain-side dummy cells.

16. The semiconductor memory device of claim 12, wherein the peripheral circuit independently controls voltage levels applied to source-side dummy lines, which are connected to the source-side dummy cells, according to a position of the source-side dummy cells during the read operation.

17. The semiconductor memory device of claim 16, wherein the peripheral circuit lowers the voltage levels applied to the source-side dummy lines as the source-side dummy lines become closer to the source line during the read operation.

18. The semiconductor memory device of claim 16, wherein the peripheral circuit controls the voltage levels applied to the source-side dummy lines to turn on the source-side dummy cells.

19. A semiconductor memory device, comprising:
memory strings including drain-side memory cells that are connected between a bit line and a pipe transistor, and source-side memory cells that are connected between the pipe transistor and a source line; and
a peripheral circuit that is suitable for increasing a pipe gate voltage applied to a pipe gate of the pipe transistor in a stepwise manner during a read operation.

20. The semiconductor memory device of claim 19, wherein the peripheral circuit is suitable for decreasing the pipe gate voltage applied to the pipe gate of the pipe transistor in a stepwise manner after the read operation.

* * * * *